United States Patent
Matsumoto et al.

(10) Patent No.: US 9,293,446 B2
(45) Date of Patent: Mar. 22, 2016

(54) LOW PROFILE SEMICONDUCTOR MODULE WITH METAL FILM SUPPORT

(71) Applicant: Murata Manufacturing Co., Ltd., Kyoto (JP)

(72) Inventors: Mitsuhiro Matsumoto, Kyoto (JP); Yoichi Takagi, Kyoto (JP); Tadashi Nomura, Kyoto (JP); Akihiko Kamada, Kyoto (JP); Nobuaki Ogawa, Kyoto (JP); Kensei Nishida, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/603,433

(22) Filed: Jan. 23, 2015

(65) Prior Publication Data
US 2015/0179621 A1      Jun. 25, 2015

Related U.S. Application Data

(63) Continuation of application No. PCT/JP2013/066790, filed on Jun. 19, 2013.

(30) Foreign Application Priority Data

Jul. 26, 2012   (JP) .................................. 2012-165608

(51) Int. Cl.
*H01L 23/31*   (2006.01)
*H01L 25/16*   (2006.01)
(Continued)

(52) U.S. Cl.
CPC .......... *H01L 25/165* (2013.01); *H01L 23/3135* (2013.01); *H01L 23/49811* (2013.01);
(Continued)

(58) Field of Classification Search
CPC .............. H01L 25/165; H01L 25/0652; H01L 23/3135; H01L 23/49838; H01L 23/49811; H01L 24/17

USPC .......................................................... 257/737
See application file for complete search history.

(56) References Cited

U.S. PATENT DOCUMENTS 6,563,757 B2      5/2003   Agata
2008/0253954 A1*  10/2008  Moriya et al. ................ 423/331
(Continued)

FOREIGN PATENT DOCUMENTS

EP      1189282 A1 *   3/2002
JP      H10-050926 A    2/1998
(Continued)

OTHER PUBLICATIONS

Office Action issued in Japanese Patent Application No. 2014-526821 dated Feb. 17, 2015.
(Continued)

*Primary Examiner* — Christine Enad
(74) *Attorney, Agent, or Firm* — Pearne & Gordon LLP

(57) ABSTRACT

A low profile module is provided that has a high functionality achieved by increasing the component mounting density. In spite of achieving high functionality in a module 100 by respectively mounting components such as a semiconductor substrate 104 and chip components 105 on the two main surfaces 101a and 101b of a wiring substrate 101, the low-profile module 100 can be provided which has a high functionality as a result of increasing its component mounting density by forming a thickness Ha of a first component layer 102 formed by mounting only the semiconductor substrate 104 face down on one main surface 101a of the wiring substrate 101 so as to be smaller than the thickness of a second component layer 103 formed by mounting a plurality of chip components 105 on the other main surface 101b of the wiring substrate 101.

15 Claims, 5 Drawing Sheets

(51) Int. Cl.
 H01L 23/498 (2006.01)
 H01L 25/065 (2006.01)
 H01L 23/00 (2006.01)
 H01L 23/50 (2006.01)

(52) U.S. Cl.
 CPC .......... *H01L23/49838* (2013.01); *H01L 24/17* (2013.01); *H01L 25/0652* (2013.01); *H01L 25/16* (2013.01); *H01L 23/3128* (2013.01); H01L 23/50 (2013.01); H01L 24/16 (2013.01); H01L 24/32 (2013.01); H01L 24/73 (2013.01); H01L 2224/16113 (2013.01); H01L 2224/16225 (2013.01); H01L 2224/16227 (2013.01); H01L 2224/32225 (2013.01); H01L 2224/73253 (2013.01); H01L 2924/12042 (2013.01); H01L 2924/15321 (2013.01); H01L 2924/18161 (2013.01); H01L 2924/19106 (2013.01)

(56) References Cited

U.S. PATENT DOCUMENTS

2010/0244228 A1* 9/2010 Sakata et al. .................. 257/692
2011/0182039 A1* 7/2011 Kato et al. .................... 361/736
2012/0176751 A1 7/2012 Sakai

FOREIGN PATENT DOCUMENTS

| JP | 2001-007256 | A | 1/2001 |
| JP | 2002-343904 | A | 11/2002 |
| JP | 2003-168870 | A | 6/2003 |
| JP | 2005-203633 | A | 7/2005 |
| JP | 2007-281160 | A | 10/2007 |
| JP | 2008-205071 | A | 9/2008 |
| WO | 2007/132612 | A1 | 11/2007 |
| WO | 2010/018708 | A1 | 2/2010 |
| WO | 2010/041589 | A1 | 4/2010 |
| WO | 2011/030542 | A2 | 3/2011 |

OTHER PUBLICATIONS

International Search Report issued in Application No. PCT/JP2013/066790 dated Aug. 6, 2013.

Written Opinion issued in Application No. PCT/JP2013/066790 dated Aug. 6, 2013.

* cited by examiner

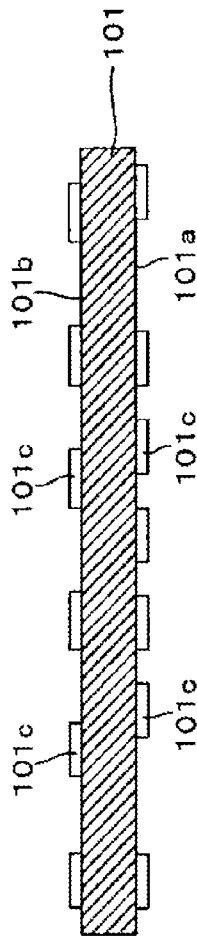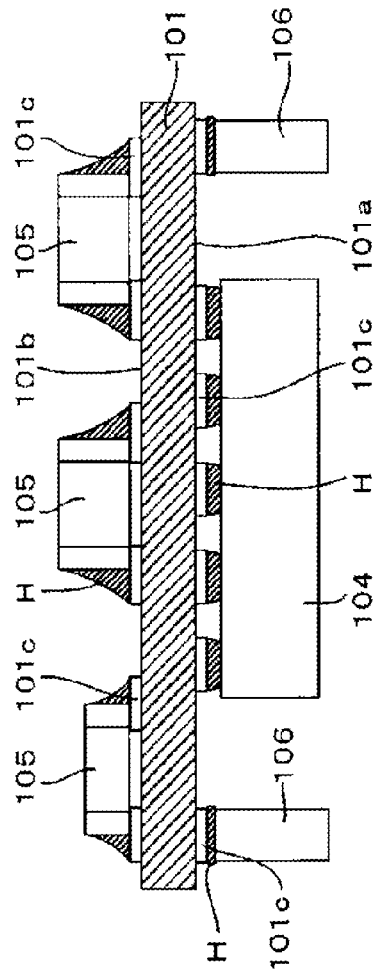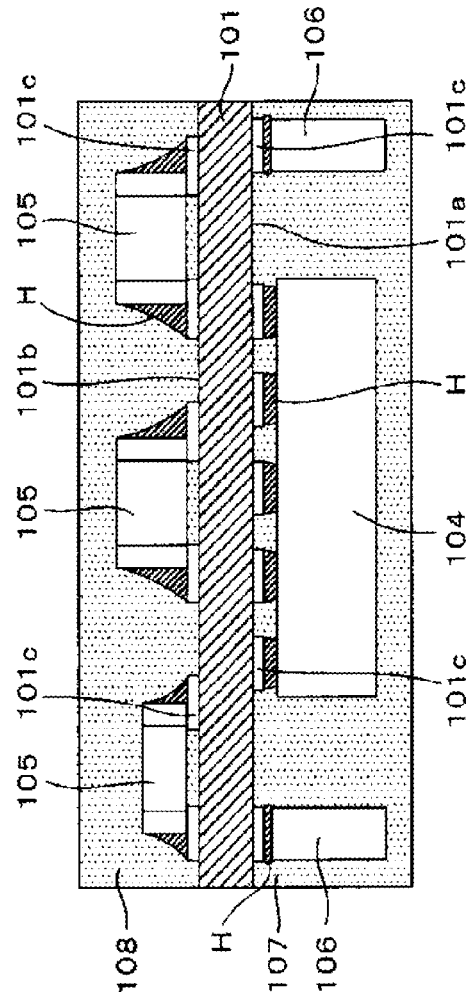
FIG. 2A
FIG. 2B
FIG. 2C

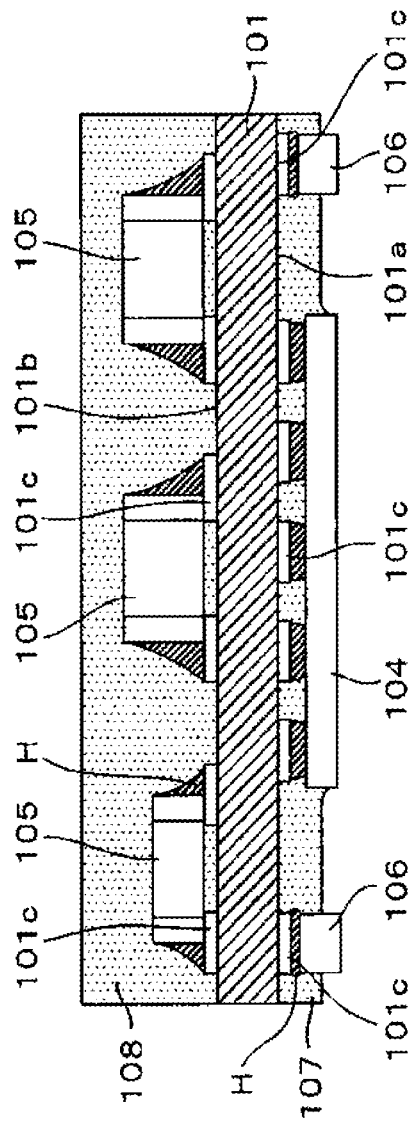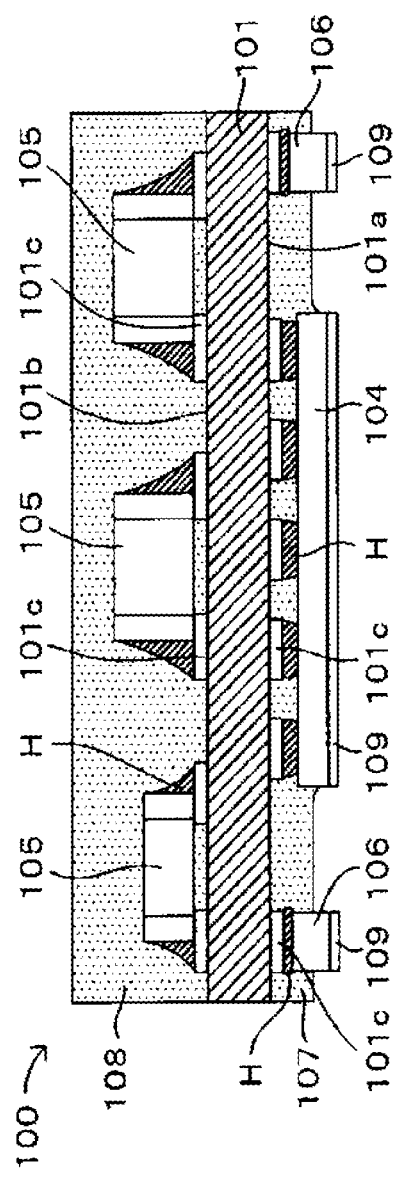

LOW PROFILE SEMICONDUCTOR MODULE WITH METAL FILM SUPPORT

BACKGROUND OF THE INVENTION

1. Field of the Invention

The present invention relates to a module in which components are mounted on both of the main surfaces of a wiring substrate.

2. Description of the Related Art

In the related art, as examples of modules to be installed in an information communication terminal such as a cellular phone or a mobile information terminal, modules that are known include a module 500 of the related art illustrated in FIG. 6. In the module 500, columnar external connection terminals 502 (electrode posts) are provided in an upright manner on a wiring substrate 501, and a semiconductor substrate 503 is mounted face down on one main surface of the wiring substrate 501, is electrically connected to the connection terminals 502, and is covered with a resin layer 504. A module like the module 500 is for example formed in the following way. After mounting the semiconductor substrate 503 face down on one main surface of the wiring substrate 501 on which the connection terminals 502 are provided in an upright manner, the resin layer 504 is formed by filling resin so as to cover the connection terminals 502 and the semiconductor substrate 503 on the one main surface of the wiring substrate 501. Then, the module 500 is completed by polishing or grinding the upper surface of the resin layer 504 such that the upper end surfaces of the connection terminals 502 and the back surface of the semiconductor substrate 503 are exposed.

Patent Document 1: Japanese Unexamined Patent Application Publication No. 2002-343904 (refer to paragraph 0013 and FIG. 1 for example)

BRIEF SUMMARY OF THE INVENTION

In recent years, decreases in the size and thickness and increases in the functionality of information communication terminals have been rapidly progressing, and it is demanded that modules to be installed in such information communication terminals have higher functionality achieved by increasing the component mounting density while also suppressing an increase in the profile of the module. In addition, when the functionality of a module is increased by increasing the component mounting density, there is a risk that unwanted radiation from certain electrical circuits formed on a semiconductor substrate mounted in the module installed in the information communication terminal will affect other components mounted in the module or other modules installed in the information communication terminal and therefore appropriate measures against this have been demanded.

In light of the above-described problem, a first object of the present invention is to provide a module having a high functionality with the increased component mounting density while also having a reduced profile. In addition, a second object of the present invention is to provide a technology that is capable of suppressing the effect of unwanted radiation from a semiconductor substrate mounted in the module.

In order to achieve the first object described above, a module of the present invention in which components are mounted on both of main surfaces of a wiring substrate, includes a first component layer provided on one main surface of the wiring substrate and comprising only a semiconductor substrate as a component mounted face down on the one main surface and a second component layer provided on another main surface of the wiring substrate and comprising a plurality of components mounted on the other main surface. A thickness of the first component layer is smaller than a thickness of the second component layer.

In the thus-configured invention, the functionality of the module is increased by increasing the component mounting density by mounting the components on both sides of the wiring substrate. On the other hand, the thickness of the first component layer provided on the one main surface of the wiring substrate and formed by mounting only the semiconductor substrate facedown as a component on the one main surface is made smaller than the thickness of the second component layer provided on the other main surface of the wiring substrate and formed by mounting the plurality of chip components on the other main surface.

That is, since the electrical characteristics of the semiconductor substrate do not greatly change even if a back-surface side of the semiconductor substrate, which is mounted face down on the one main surface of the wiring substrate, is subjected to polishing or grinding, the semiconductor substrate can be made thinner by subjecting the back-surface side of the semiconductor substrate to polishing or grinding without damaging the certain electrical circuits formed on the front-surface side. Consequently, the first component layer provided on the one main surface of the wiring substrate is formed by mounting facedown only the semiconductor substrate as a component and therefore the thickness of the first component layer can be made smaller than the thickness of the second component layer by subjecting the back-surface side of the semiconductor substrate of the first component layer to polishing or grinding in order reduce the thickness of the semiconductor substrate.

Therefore, in spite of the increase in the functionality achieved by mounting components on both of the main surfaces of the wiring substrate, a low-profile module can be provided which has high functionality as a result of increasing its component mounting density by making the thickness of the first component layer formed by mounting only the semiconductor substrate facedown on the one main surface of the wiring substrate smaller than the thickness of the second component layer formed by mounting the plurality of components on the other main surface of the wiring substrate.

In addition, the thickness of the first component layer may be smaller than a height of a component having the smallest height from the other main surface among the components mounted on the other main surface side of the wiring substrate.

With this configuration, since the thickness of the first component layer is made smaller than the height of the component having the smallest height from the other main surface among the components mounted on the other main surface side of the wiring substrate, the profile of the module can be more effectively reduced in size.

In addition, in order to achieve the second object described above, the module of the present invention is characterized in that the first component layer includes a plurality of columnar external connection terminals provided in an upright manner on the one main surface of the wiring substrate and electrically connected to the semiconductor substrate mounted on the one main surface, and the plurality of connection terminals includes a ground terminal.

In the thus-configured invention, although the first component layer includes the plurality of columnar external connection terminals provided in an upright manner on the one main surface of the wiring substrate and electrically connected to the semiconductor substrate mounted on the one main surface, the plurality of connection terminals includes a ground terminal and the first component layer is formed thinner than the second component layer and therefore the connection terminals are formed shorter than they would be if the external connection terminals were provided in the second component layer.

Therefore, by making the plurality of external connection terminals including a ground terminal shorter, the parasitic inductances of the connection terminals are reduced and therefore the electrical connection between an external ground electrode and the semiconductor substrate formed when the module is installed on for example the external mother substrate can be strengthened. In addition, in the case where the module is installed on for example an external mother substrate, the semiconductor substrate included in the thinly formed first component layer is arranged between the mother substrate and the wiring substrate of the module and is arranged close to the ground electrodes of both substrates, and therefore unwanted radiation from the semiconductor substrate is readily absorbed by the ground electrodes of the mother substrate and the wiring substrate and the effect of unwanted radiation from the semiconductor substrate mounted in the module can be suppressed.

In addition, it is preferable that a surface area in plan view of the semiconductor substrate mounted on the one main surface of the wiring substrate be larger than a surface area in plan view of each of the other components among the components mounted on both of the main surfaces.

With this configuration, although the first component layer provided on the one main surface of the wiring substrate is formed thinner than the second component layer provided on the other main surface, the surface area in plan view of the semiconductor substrate of the thinly formed first component layer is made larger than the surface area in plan view of each of the other components and therefore the generation of the bending in the module caused by the bending of the wiring substrate can be prevented.

In addition, it is preferable that the first component layer include a first resin layer provided on the one main surface and covering side surfaces of the semiconductor substrate such that a back surface of the semiconductor substrate on the one main surface of the wiring substrate is exposed, that the second component layer include a second resin layer provided on the other main surface and covering each of the components on the other main surface of the wiring substrate, and that a linear expansion coefficient of a resin forming the first resin layer be larger than a linear expansion coefficient of a resin forming the second resin layer.

With this configuration, although the first resin layer of the first component layer is formed thinner than the second resin layer of the second component layer, the first resin layer is formed of a resin having a larger linear expansion coefficient than the resin forming the second resin layer and as a result the difference between the size of the contractive force of the thin first resin layer and the size of the contractive force of the thick second resin layer can be made small, and therefore the generation of the bending caused by the contraction of the resins in the module can be suppressed.

In addition, it is preferable that a certain electrical circuit be formed on a front surface of the semiconductor substrate facing the one main surface of the wiring substrate, and that a ceramic multilayer chip component be included in the components on the other main surface side of the wiring substrate.

With this configuration, although the components on the other main surface of the wiring substrate include a ceramic multilayer chip component that cannot be made thinner by polishing or grinding and the thickness of the second component layer cannot be made smaller than the height of the chip component, a low-profile practical module can be provided by making the thickness of the first component layer, which is formed by mounting only the semiconductor substrate as a component, smaller than the thickness of the second component layer.

According to the present invention, a low-profile module can be provided that has a high functionality achieved by increasing the component mounting density by making the thickness of a first component layer formed by mounting only a semiconductor substrate face down on one main surface of a wiring substrate smaller than the thickness of a second component layer formed by mounting a plurality of components on the other main surface of the wiring substrate.

BRIEF DESCRIPTION OF THE SEVERAL VIEWS OF THE DRAWINGS

FIGS. 2A to 2E illustrate a method of manufacturing the module provided in the module-installed apparatus of FIG. 1 with different states.

DETAILED DESCRIPTION OF THE INVENTION

Figure 1:
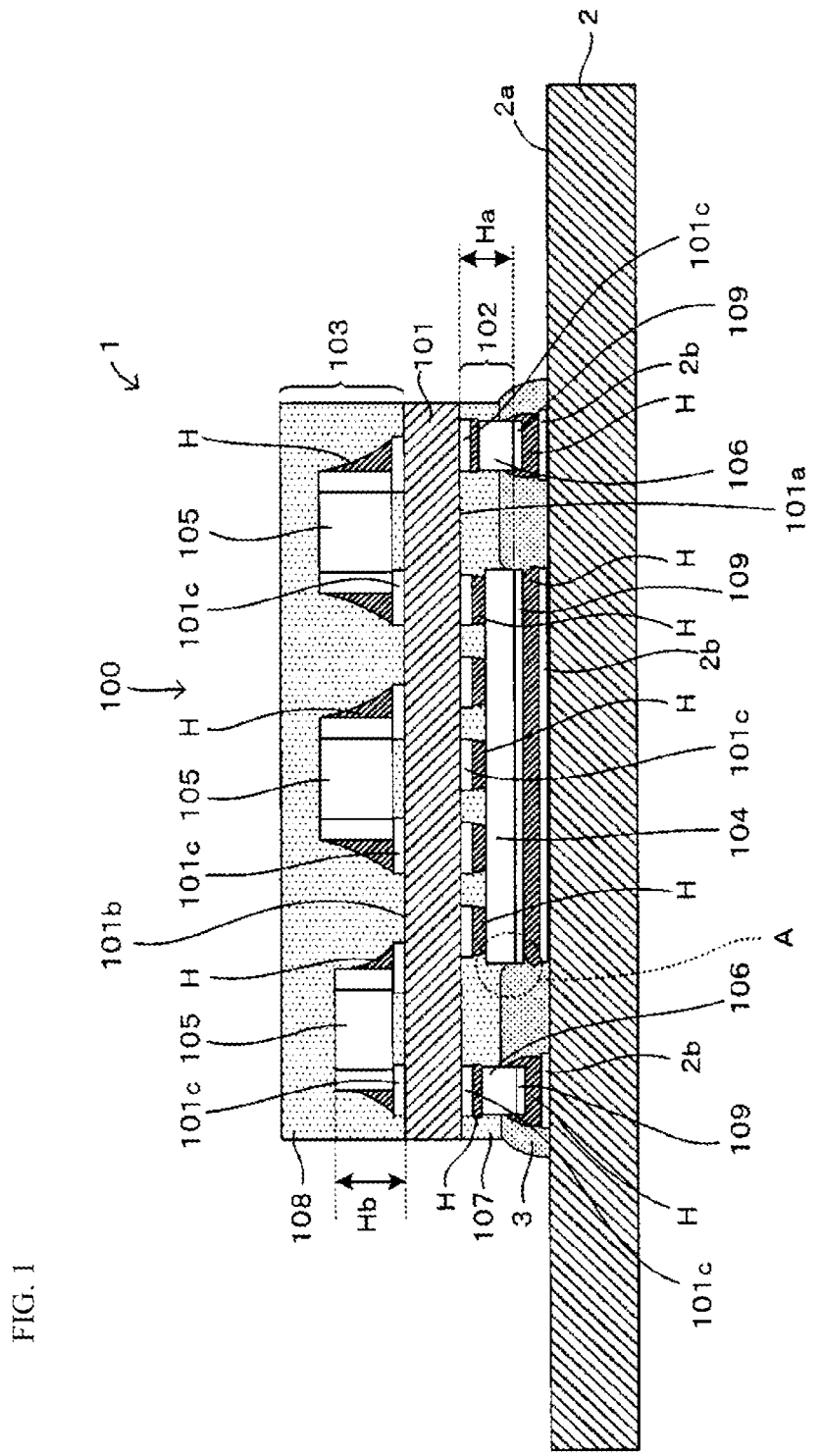
FIG. 1 illustrates a module-installed apparatus that is equipped with a module according to the present invention.
Figure 3:
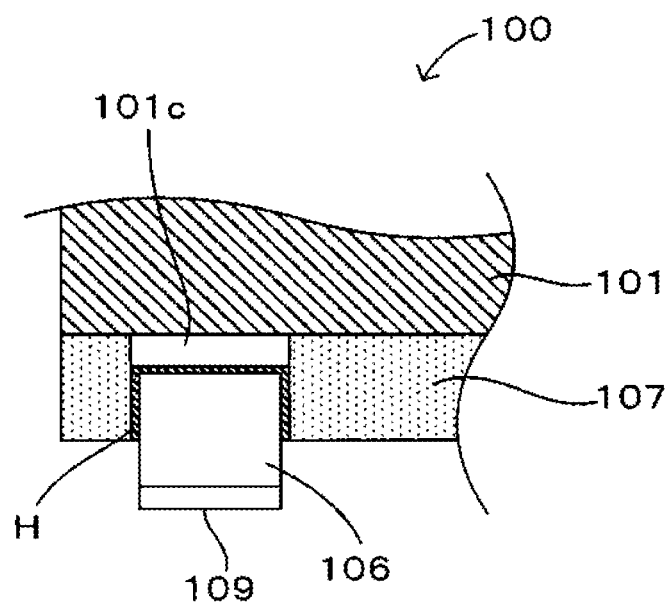
FIG. 3 is an enlarged view of a main part in which an example of a connection terminal is illustrated.

An embodiment of the present invention will be described with reference to FIGS. 1 to 3. FIG. 1 illustrates a module-installed apparatus that is equipped with a module according to the present invention and FIGS. 2A to 2E illustrate a method of manufacturing the module provided in the module-installed apparatus of FIG. 1 with different states. In addition, FIG. 3 is an enlarged view showing a main part of one example of a connection terminal.

(Module-Installed Apparatus)

A module-installed apparatus 1, as illustrated in FIG. 1, is equipped with a mother substrate 2, a module 100 mounted on the mother substrate 2 and an underfill resin layer 3 that is formed of a resin in order to protect the connection portions between the mother substrate 2 and the module 100. The module-installed apparatus 1 is installed in an information communication terminal such as a cellular phone or a mobile information terminal.

Inside the mother substrate 2, there is provided a wiring pattern (not illustrated) that includes a ground electrode for grounding and the wiring pattern is connected through via conductors (not illustrated) and so forth to mounting electrodes 2b formed on a mounting surface 2a of the mother substrate 2. In addition, the mother substrate 2 is formed of a material that is typically used to form substrates such as a resin material such as a glass epoxy resin or a liquid crystal polymer or a ceramic material. Moreover, the wiring pattern and the via conductors are formed of a conductive material such as Ag, Cu or Au and a variety of electrical circuits may be formed inside the mother substrate 2 and connected to the wiring pattern through via conductors and so forth.

In addition, the module 100 is mounted on the mounting surface 2a by connecting metal films 109, which are formed on the tip surfaces of external connection terminals 106 and on the back surface of a semiconductor substrate 104, to the mounting electrodes 2b of the mother substrate 2 by using solder H. In this embodiment, the metal films 109 formed on the back surface of the semiconductor substrate 104 are connected using solder H to the mounting electrodes 2b, which are connected to the electrodes provided in the mother substrate 2.

The underfill resin layer 3 is formed by filling for example an epoxy resin into the space between the module 100, which is mounted on the mounting surface 2a of the mother substrate 2, and the mother substrate 2.

(Module)

The module 100 is formed as a high-frequency module such as a Bluetooth (registered trademark) module, a wireless LAN module or an antenna switch module by mounting components such as the semiconductor substrate 104 and ceramic multilayer chip components 105 on the two main surfaces 101a and 101b of a wiring substrate 101, and as illustrated in FIG. 1 is equipped with the wiring substrate 101, a first component layer 102, which is provided on one main surface 101a of the wiring substrate 101 and is formed by facedown mounting only the semiconductor substrate 104 as a component on the one main surface 101a, and a second component layer 103, which is provided on the other main surface 101b of the wiring substrate 101 and is formed by mounting a plurality of chip components 105 on the other main surface 101b.

The wiring substrate 101 is formed of a typical substrate such as a resin substrate such as a glass epoxy resin substrate or a liquid crystal polymer substrate, a ceramic (LTCC) substrate or a glass substrate, and the wiring substrate 101 may be formed as either a single layer substrate or a multilayer substrate in accordance with the intended use of the module 100. In addition, a plurality of mounting electrodes 101c for mounting components and so forth are formed on the two main surfaces 101a and 101b of the wiring substrate 101, and the mounting electrodes 101c are electrically connected through via conductors (not illustrated) and so forth to a wiring pattern (not illustrated) including a ground electrode and so forth provided inside the wiring substrate 101 and formed of a conductive material such as Ag, Cu or Au.

For example, in the case where the wiring substrate 101 is formed of a low temperature co-fired ceramic (LTCC) multilayer substrate, the wiring substrate 101 is formed in the following manner. First, ceramic green sheets are prepared by forming a slurry obtained by mixing a mixed powder composed of for example alumina and glass together with for example an organic binder and a solvent into sheet-like shapes. Next, via conductors for interlayer connection are formed by filling via holes formed by performing laser processing at certain positions on the ceramic green sheets with conductive paste containing for example Ag or Cu, and various wiring patterns are formed by printing using a conductive paste. Then, the wiring substrate 101 is formed by forming a ceramic multilayer body by stacking the ceramic green sheets on top of one another and subjecting them to press bonding, and then subjecting the ceramic multilayer body to firing at a low temperature of around 1000° C., that is, to low-temperature firing.

The first component layer 102 includes a plurality of columnar connection terminals 106 for external connection, which are formed by providing in an upright manner a plurality of cylindrical metal members composed of Cu or the like on the one main surface 101a of the wiring substrate 101 and are electrically connected to the semiconductor substrate 104 mounted on the one main surface 101a, and at least one of the connection terminals 106 is formed as a ground terminal. In addition, on a front surface of the semiconductor substrate 104 provided in the first component layer 102 that faces to the one main surface 101a of the wiring substrate 101, certain electrical circuits (not illustrated) are formed to provide a system IC that processes RF signals and baseband signals. In addition, the semiconductor substrate 104 has a bare chip structure or a wafer level chip size package (WL-CSP) structure cut out from a semiconductor wafer composed of Si for example and is mounted face down on the one main surface 101a of the wiring substrate 101.

In addition, the first component layer 102 includes a first resin layer 107 provided on the one main surface 101a and covering the side surfaces of the semiconductor substrate 104 and the connection terminals 106. The first component layer 102 is formed by filling a typical molding-use resin such as an epoxy resin onto the one main surface 101a such that the back surface of the semiconductor substrate 104 and the tip surfaces of the connection terminals 106 mounted on the one main surface 101a of the wiring substrate 101 are left exposed. In this embodiment, as illustrated in FIG. 1, the first resin layer 107 is formed so as to cover the part of the side surfaces of each of the semiconductor substrate 104 and the connection terminals 106 so as to leave a back-surface-side end portion of the semiconductor substrate 104 and the tips of the connection terminals 106 exposed. That is, the first resin layer 107 is formed so that the back-surface-side end portion of the semiconductor substrate 104 and the tips of the connection terminals 106 protrude from the front surface of the first resin layer 107.

In addition, the portions of the front surface of the first resin layer 107 that contact the side surfaces of the semiconductor substrate 104 are formed so as to have a fillet shape that widens from a back-surface-side edge of the semiconductor substrate 104 at a side surface of the semiconductor substrate 104 toward the first resin layer 107, as indicated by a region A enclosed by a dotted line in FIG. 1. In addition, the corners of the part of the semiconductor substrate 104 that protrudes from the front surface of the first resin layer 107 are chamfered (not illustrated).

In addition, the metal films 109 are formed on the back surface of the semiconductor substrate 104 and tip surfaces of the connection terminals 106, which are exposed from the first resin layer 107, by performing Ni/Au plating. In addition, in this embodiment, as illustrated in FIG. 1, the height of the semiconductor substrate 104 and the height of each of the connection terminals 106 from the one main surface 101a in a state where they are mounted on the one main surface 101a of the wiring substrate 101 are formed so as to be the same height Ha (thickness of first component layer 102).

The second component layer 103 includes a second resin layer 108 provided on the other main surface 101b so as to cover the chip components 105 by filling a typical molding-use resin such as an epoxy resin onto the other main surface 101b of the wiring substrate 101. In addition, the chip components 105 such as chip capacitors, chip inductors and chip resistors are mounted by using a typical surface mounting technique using solder H on the other main surface 101b of the wiring substrate 101. In this embodiment, since the second resin layer 108 is provided so as to cover the chip components 105 mounted on the other main surface 101b of the wiring substrate 101, the thickness of the second resin layer 108 is the same as the thickness of the second component layer 103.

In addition, in this embodiment, as illustrated in FIG. 1, the second component layer 103 includes a plurality of chip components 105 having different heights from the other main surface 101b in a state of having been mounted on the other main surface 101b of the wiring substrate 101. By making the thickness Ha of the first component layer 102 smaller than a height Hb of a chip component 105 having the smallest height from the other main surface 101b among the chip components 105 mounted on the other main surface 101b of the wiring substrate 101, the thickness of the first component layer 102 is made smaller than the thickness of the second component layer 103.

In addition, in this embodiment, the surface area in plan view of the semiconductor substrate 104 mounted on the one main surface 101a of the wiring substrate 101 is made larger than the surface area in plan view of each chip component 105 among the individual components mounted on the two main surfaces 101a and 101b of the wiring substrate 101. With above-described configuration, the first component layer 102 provided on the one main surface 101a of the wiring substrate 101 is formed thinner than the second component layer 103 provided on the other main surface 101b, but the plan view surface area of the semiconductor substrate 104 of the thinly formed first component layer 102 is made larger than the plan view area of each chip component 105 and the semiconductor substrate 104 is harder than resin and therefore generation of bending in the module 100 caused by bending of the wiring substrate 101 due to contraction when the resin layers 107 and 108 harden can be suppressed.

In addition, in this case, it is preferable that the linear expansion coefficient of the resin forming the first resin layer 107 of the first component layer 102 be made larger than the linear expansion coefficient of the resin forming the second resin layer 108 of the second component layer 103. In this configuration, the first resin layer 107 of the first component layer 102 is formed thinner than the second resin layer 108 of the second component layer 103, but since the first resin layer 107 is formed of a resin having a larger linear expansion coefficient than the resin forming the second resin layer 108, the difference between the size of the contractive force at the time of hardening of the thin first resin layer 107 and the size of the contractive force at the time of hardening of the thick second resin layer 108 is small and the balance can be obtained between the forces pulling the wiring substrate 101 from the sides of the two main surfaces 101a and 101b, and therefore the generation of the bending caused by the contraction of the resins forming the resin layers 107 and 108 can be suppressed in the module 100.

In addition, the connection terminals 106 may be formed such that the height of the connection terminals 106 from the one main surface 101a of the wiring substrate 101 is larger than the height of the semiconductor substrate 104 from the one main surface 101a. By forming the connection terminals 106 in this way, the mountablility of the module 100 at the time of mounting the module 100 on the mother substrate 2 can be improved without the semiconductor substrate 104 being an obstruction.

In addition, the connection terminals 106 may be formed such that the height of the semiconductor substrate 104 from the one main surface 101a of the wiring substrate 101 is larger than the height of the connection terminals 106 from the one main surface 101a. In this case, since the distance between the back surface of the semiconductor substrate 104 and the mounting surface 2a of the mother substrate 2 when the module 100 is connected to the mother substrate 2 is smaller, the heat generated by the module 100 is more easily radiated via a planar ground electrode (not illustrated) formed in the mother substrate 2 and therefore the heat radiation characteristics of the module 100 can be improved. In addition, in the case where the mounting electrodes 2b of the mother substrate 2 and the connection terminals 106 are connected to each other using solder H, the distance between the mother substrate 2 and the connection terminals 106 is larger than the distance between the mother substrate 2 and the semiconductor substrate 104 and therefore a gap can be secured between the mother substrate 2 and the connection terminals 106, and the solder H joining the mother substrate 2 and the connection terminals 106 is not pressed down and the solder H is not likely to protrude outward from the joint portions and therefore short circuiting of adjacent connection terminals 106 and mounting electrodes 2b due to the melted solder H can be prevented.

(Method of Manufacturing Module)

Next, an example of a method of manufacturing the module 100 will be described.

First, as illustrated in FIG. 2A, the wiring substrate 101 is prepared in which a wiring pattern for forming a ground electrode for grounding is provided thereinside and the mounting electrodes 101c, which are electrically connected to the wiring pattern through via conductors or the like, are provided on the two main surfaces 101a and 101b (wiring substrate preparation step). Next, as illustrated in FIG. 2B, the semiconductor substrate 104, the chip components 105 and cylindrical metal members for forming the connection terminals 106 are surface mounted on the corresponding mounting electrodes 101c provided on the two main surfaces 101a and 101b of the wiring substrate 101 using solder H (component mounting step). The semiconductor substrate 104 is flip chip mounted face down on the mounting electrodes 101c on the one main surface 101a of the wiring substrate 101 and the chip components 105 are mounted using a known surface mounting technique on the other main surface 101b of the wiring substrate 101.

Next, as illustrated in FIG. 2C, the first resin layer 107 is formed so as to cover the semiconductor substrate 104 and the connection terminals 106 by filling a resin onto the one main surface 101a of the wiring substrate 101 and the second resin layer 108 is formed so as to cover the chip components 105 by filling a resin onto the other main surface 101b (resin layer forming step). Specifically, the resin layers 107 and 108 are formed by filling a resin using a dispenser, are formed using a transfer mold technique or a compression mold technique, or are formed by wrapping the two main surfaces 101a and 101b of the wiring substrate 101 with resin sheets.

As described above, a module element body is prepared (refer to FIG. 2C) in which the semiconductor substrate 104 and the chip components 105 are respectively buried in the resin layers 107 and 108 and the columnar connection terminals 106 are arranged inside the first resin layer 107 in a state of being provided in an upright manner on the one main surface 101a of the wiring substrate 101 through the steps (wiring substrate preparation step to resin layer forming step) illustrated in FIGS. 2A to 2C.

Next, as illustrated in FIG. 2D, portions of the resin are removed by polishing or grinding the front surface of the first resin layer 107 of the module element body such that a back-surface-side end portion of the semiconductor substrate 104 and tips of the connection terminals 106 are exposed from the front surface of the first resin layer 107 (removal step). In the case where the resin of the first resin layer 107 is removed by polishing, it is preferable to perform the removal step using grinding in which a cup grinding wheel is used, lap polishing in which a loose abrasive is used or sandblasting. That is, by adjusting the particle diameter and material of the loose abrasive, the resin forming the first resin layer 107 can be more preferentially removed by polishing from the first component layer 102 from the back surface of the semiconductor substrate 104 and the tip surfaces of the connection terminals 106. Therefore, the first resin layer 107 covering the portions of the side surfaces of the semiconductor substrate 104 and the connection terminals 106 can be easily formed on the one main surface 101a of the wiring substrate 101 such that a back-surface-side end portion of the semiconductor substrate 104 and tips of the connection terminals 106 are exposed.

In addition, with the removal step, together with chamfering of the corners of the part of the semiconductor substrate 104 that protrudes from the front surface of the first resin layer 107, the portions of the front surface of the first resin layer 107 that contact the side surfaces of the semiconductor substrate 104 are formed so as to have a fillet shape that widens from a back-surface-side edge of the semiconductor substrate 104 at a side surface of the semiconductor substrate 104 toward the first resin layer 107 (refer to region A in FIG. 1). In addition, unevenness is formed in the back surface of the semiconductor substrate 104 as a result of the back surface of the semiconductor substrate 104 being subjected to polishing or grinding.

If a surface roughness Ra of the back surface of the semiconductor substrate 104 is too small, it will be difficult to form the metal film 109 by for example performing a plating treatment on the back surface of the semiconductor substrate 104 and if the surface roughness Ra is too large, there is a risk that the semiconductor substrate 104 will be damaged and therefore it is preferable that the back surface of the semiconductor substrate 104 be polished or ground such that the surface roughness Ra of the back surface comes to be in the range of 0.1 µm to 15 µm.

In addition, in this embodiment, in the removal step, along with the front surface of the first resin layer 107, the back-surface-side end portion of the semiconductor substrate 104 and the tips of the connection terminals 106 are subjected to polishing or grinding such that the height of the semiconductor substrate 104 and the height of the connection terminals 106 from the one main surface 101a of the wiring substrate 101 come to be the same. In this embodiment, the back-surface-side end portion of the semiconductor substrate 104 and the tips of the connection terminals 106 are subjected to polishing or grinding such that the height Ha of the semiconductor substrate 104 and the connection terminals 106, which have the largest height from the one main surface 101a of the wiring substrate 101, is smaller than the height Hb of the chip component 105 that has the smallest height from the other main surface 101b of the wiring substrate 101.

Next, as illustrated in FIG. 2E, the module 100 is completed by forming the metal films 109 on the back surface of the semiconductor substrate 104 and the tip surfaces of the connection terminals 106 exposed from the front surface of the first resin layer 107 by using a typical method such as plating treatment, screen printing or deposition (metal film formation step). For example, in the case where the metal films 109 are formed by a plating treatment, the metal films 109 are formed by first forming a Ni layer on the back surface of the semiconductor substrate 104 and the tip surfaces of the connection terminals 106 and then forming an Au layer on the formed Ni layer.

The metal film 109 on the back surface of the semiconductor substrate 104 does not have to be formed over the entire back surface of the semiconductor substrate 104 and it is sufficient that the metal film 109 be formed on at least part of the back surface of the semiconductor substrate 104. In addition, unevenness does not necessarily have to be formed on the back surface of the semiconductor substrate 104, but when unevenness is formed on the back surface of the semiconductor substrate 104, unevenness is also formed on the metal film 109 when the metal film 109 is formed on the back surface on which unevenness has been formed and therefore the surface area of the metal film 109, which has a high thermal conductivity, can be increased.

Then the module-installed apparatus 1 is manufactured by arranging the thus-manufactured module 100 so that the one main surface 101a of the wiring substrate 101 faces the mounting surface 2a of the mother substrate 2 and connecting the metal films 109 formed on the back surface of the semiconductor substrate 104 and the tip surfaces of the connection terminals 106 and the mounting electrodes 2b formed on the mounting surface 2a of the mother substrate 2 using solder H.

The heights of the semiconductor substrate 104 and the connection terminals 106 from the one main surface 101a of the wiring substrate 101 do not necessarily have to be made the same as each other and the back-surface-side end portion of the semiconductor substrate 104 and the tips of the connection terminals 106 may be subjected to polishing or grinding so as to have different heights. In this case, the heights of the semiconductor substrate 104 and the connection terminals 106 from the one main surface 101a can be adjusted by changing the particle diameter or material of the loose abrasive used in the polishing.

In this way, according to the above-described embodiment, high functionality is achieved for the module 100 by increasing the component mounting density by respectively mounting components such as the semiconductor substrate 104 and the chip components 105 on the two main surfaces 101a and 101b of the wiring substrate 101. On the other hand, the thickness Ha of the first component layer 102 provided on the one main surface 101a of the wiring substrate 101 and formed by mounting only the semiconductor substrate 104 facedown as a component on the one main surface 101a is made smaller than the thickness of the second component layer 103 provided on the other main surface 101b of the wiring substrate 101 and formed by mounting the plurality of chip components 105 on the other main surface 101b.

That is, since certain electrical circuits are formed on the front surface side of the semiconductor substrate 104, which is mounted face down on the one main surface 101a of the wiring substrate 101, and the electrical characteristics of the semiconductor substrate 104 are largely unchanged even though the back-surface side of the semiconductor substrate 104 is subjected to polishing or grinding, the semiconductor substrate 104 can be made thinner by polishing or grinding the back surface side of the semiconductor substrate 104 without damaging the electrical circuits formed on the front-surface side of the semiconductor substrate 104. Consequently, the first component layer 102 provided on the one main surface 101a of the wiring substrate 101 is formed by mounting facedown only the semiconductor substrate 104 as a component and therefore the thickness of the first component layer 102 can be made smaller than the thickness of the second component layer 103 by subjecting the back surface side of the semiconductor substrate 104 of the first component layer 102 to polishing or grinding in order reduce the thickness of the semiconductor substrate 104.

Therefore, in spite of the high functionality achieved in the module 100 by respectively mounting components such as the semiconductor substrate 104 and the chip components 105 on the two main surfaces 101a and 101b of the wiring substrate 101, the low profile module 100 can be provided which has high functionality as a result of increasing the component mounting density by forming the thickness Ha of the first component layer 102 formed by mounting only the semiconductor substrate 104 face down on the one main surface 101a of the wiring substrate 101 so as to be smaller than the thickness of the second component layer 103 formed by mounting the plurality of chip components 105 on the other main surface 101b of the wiring substrate 101.

In addition, since thickness Ha of the first component layer 102 is made smaller than the height Hb of the chip component 105 having the smallest height from the other main surface 101b among the chip components 105 mounted on the other main surface 101b of the wiring substrate 101, the profile of the module 100 can be more effectively reduced in size.

In addition, although the first component layer 102 includes the plurality of external columnar connection terminals 106, which are provided in an upright manner on the one main surface 101a of the wiring substrate 101 and electrically connected to the semiconductor substrate 104 mounted on the one main surface 101a, the plurality of connection terminals 106 includes a ground terminal and the first component layer 102 is formed thinner than the second component layer 103 and therefore the connection terminals 106 are formed shorter than they would be if the external connection terminals 106 were provided in the second component layer 103.

Therefore, as a result of forming the plurality of external connection terminals 106 including a ground terminal shorter, the parasitic inductances of the connection terminals 106 are reduced and therefore the electrical connection between a ground electrode and the semiconductor substrate 104 formed when the module 100 is installed on for example the external mother substrate 2 can be strengthened. In addition, in the case where the module 100 is installed on for example the external mother substrate 2, the semiconductor substrate 104 included in the thinly formed first component layer 102 is arranged between the mother substrate 2 and the wiring substrate 101 of the module 100 and is arranged close to the ground electrodes of the substrates 2 and 101, and therefore unwanted radiation from the semiconductor substrate 104 is readily absorbed by the ground electrodes of the mother substrate 2 and the wiring substrate 101 and the effect of unwanted radiation from the semiconductor substrate 104 mounted in the module 100 can be suppressed. In addition, in the above-described embodiment, since the metal film 109 on the back surface of the semiconductor substrate 104 is connected to the mounting electrodes 2b of the mother substrate 2 and the ground electrode by solder H, the effect of unwanted radiation from the semiconductor substrate 104 can be more effectively suppressed.

In addition, although the thickness of the second component layer 103 cannot be made smaller than the height of the chip components 105 since the ceramic multilayer chip components 105 on the other main surface 101b side of the wiring substrate 101 cannot be reduced in thickness by polishing or grinding unlike the semiconductor substrate 104, a low-profile practical module 100 can be provided by forming the thickness of the first component layer 102, which is formed by mounting only the semiconductor substrate 104 as a component, smaller than the thickness of the second component layer 103.

In addition, in the above-described embodiment, the external connection terminals 106 are formed by mounting cylindrical metal members on the one main surface 101a of the wiring substrate 101 using solder H. Consequently, as illustrated in FIG. 3, the solder H covering the side surfaces of the connection terminals 106 is preferably caused to be exposed from the front surface of the first resin layer 107 by adjusting the amount of solder H applied to the mounting electrodes 101c on the one main surface 101a so as that the solder H melted when mounting the connection terminals 106 on the mounting electrodes 101c wets the side surfaces of the connection terminals 106. Thus, the area of the external connection terminals 106 in plan view can be increased and the mounting strength of the module 100 and the mother substrate 2 using solder H can be improved.

In addition, since the first resin layer 107, which covers the parts of the side surfaces of the semiconductor substrate 104 and the connection terminals 106, is formed so that the back-surface-side end portion of the semiconductor substrate 104 and the tips of the connection terminals 106 protrude and are exposed from the front surface of the first resin layer 107 on the one main surface 101a side of the wiring substrate 101 of the module 100, the surface areas of the portion of the back-surface-side end portion of the semiconductor substrate 104, which has a higher thermal conductivity than the resin forming the first resin layer 107, and the portions of the tips of the connection terminals 106, which are formed of a metal having a higher thermal conductivity than the resin, that are exposed from the front surface of the first resin layer 107 are increased and therefore the heat radiation characteristics of the module 100 can be improved.

In addition, since the back-surface-side end portion of the semiconductor substrate 104 protrudes and is exposed from the front surface of the first resin layer 107, compared with a module in which the semiconductor substrate 104 is covered by the resin, the distance between the ground electrodes provided on the back surface of the semiconductor substrate 104 and on the mother substrate 2 is smaller when the module 100 is mounted on the mother substrate 2, and therefore the heat generated by the module 100 is more easily radiated via the ground electrodes and as a result the heat radiation characteristics of the module 100 are improved. In addition, in the above-described embodiment, since the metal film 109 on the back surface of the semiconductor substrate 104 is connected to the mounting electrodes 2b of the mother substrate 2 and the ground electrode by the solder H, the heat generated by the module 100 can be more effectively radiated via the ground electrodes.

In addition, since the module 100 is formed so that the tips of the connection terminals 106 protrude from the front surface of the first resin layer 107, it is easy for the connection terminals 106 and the mounting electrodes 2b of the mother substrate 2 to contact each other and therefore the connectivity of the connection terminals 106 and the mother substrate 2 can be improved. Furthermore, since the melted solder H hardens in a fillet shape after wetting the side surfaces of the tips of the connection terminals 106 when the mounting electrodes 2b on the mounting surface 2a of the mother substrate 2 and the connection terminals 106 are connected to each other using the solder H as illustrated in FIG. 1, the strength of the connection between the module 100 and the mother substrate 2 connected using the solder H can be improved.

In addition, since the module 100 is formed so that the back-surface-side end portion of the semiconductor substrate 104 and the tips of the connection terminals 106 protrude from the front surface of the first resin layer 107, a space that is enclosed by the front surface of the first resin layer 107 and the mounting surface 2a of the mother substrate 2 is formed around the semiconductor substrate 104 and the connection terminals 106 when the module 100 is mounted on the mother substrate 2. Therefore, the solder H that is melted when mounting the module 100 on the mother substrate 2 remains in the space formed around the connection terminals 106 and the semiconductor substrate 104 and therefore short circuiting of adjacent connection terminals 106 and mounting electrodes 2b caused by melted solder H moving along the interface between the first resin layer 107 and the mounting surface 2a, which are adhered to each other, as occurred in the related art can be prevented.

In addition, when the module 100 is mounted on the mother substrate 2, the formed space that is enclosed by the front surface of the first resin layer 107 and the mounting surface 2a of the mother substrate 2 can be filled with the resin for forming the underfill resin layer 3 and the area of contact between the underfill resin layer 3 and the module 100 and the mother substrate 2 can be increased and therefore the strength with which the module 100 is mounted on the mother substrate 2 can be improved.

In addition, the portions of the front surface of the first resin layer 107 that are in contact with the side surfaces of the semiconductor substrate 104 are formed in a fillet shape that widens from the back-surface-side edge of the semiconductor substrate 104 at the side surface of the semiconductor substrate 104 toward the first resin layer 107 and therefore since the stress acting in the portions where the front surface of the first resin layer 107 and the semiconductor substrate 104 contact each other is dispersed by the resin formed in a fillet shape, the first resin layer 107 can be prevented from becoming detached from the semiconductor substrate 104.

In addition, since the corners of the part of the semiconductor substrate 104 that protrudes from the front surface of the first resin layer 107 are chamfered by polishing or grinding, the cracking or chipping of the semiconductor substrate 104 can be prevented.

In addition, since unevenness is formed on the back surface of the semiconductor substrate 104, the surface area of the part of the semiconductor substrate 104 exposed from the first resin layer 107, which has high thermal conductivity, is increased and the heat radiation characteristics of the module 100 can be improved. In addition, since a metal film 109 is formed over at least a part of the back surface of the semiconductor substrate 104, which is exposed from the first resin layer 107, the metal film 109, which has higher thermal conductivity than the semiconductor substrate 104, functions as a heat sink and as a result the heat radiation characteristics of the module 100 are further improved. In addition, since the mother substrate 2 and the module 100 can be connected to each other with solder H using the connection terminals 106 and the metal film 109 by using the metal film 109 formed on the back surface of the semiconductor substrate 104 as an electrode for connection to the ground electrode of the mother substrate 2, the strength of the connection between the mother substrate 2 and the module 100 can be improved.

In addition, since unevenness is formed on the front surface of the metal film 109 formed on the back surface of the semiconductor substrate 104, the surface area of the metal film 109 is increased and therefore the heat radiation characteristics of the module 100 can be further improved. In addition, in the case where the metal film 109 is used as an electrode for connection to the mother substrate 2, the surface area of the connection with the mother substrate 2 is increased and therefore the strength of the connection between the module 100 and the mother substrate 2 can be improved.

In addition, the back surface of the semiconductor substrate 104 is protected by forming the metal film 109 on the back surface of the semiconductor substrate 104 and therefore the semiconductor substrate 104 can be prevented from being damaged by external forces or the like.

Figure 4:
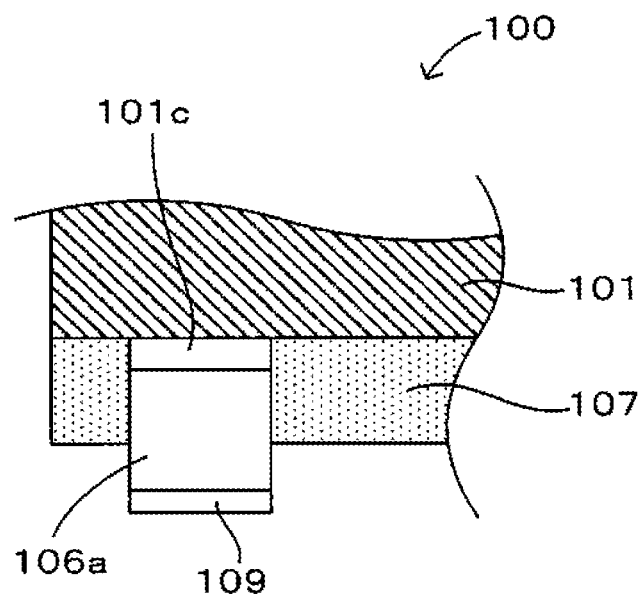
FIG. 4 is an enlarged view of a main part in which another example of a connection terminal is illustrated.

The present invention is not limited to the above-described embodiment and various modifications not described above can be made so long as they do not deviate from the gist of the invention. For example, in the above-described embodiment, the connection terminals 106 are formed by mounting cylindrical metal members on the wiring substrate 101 using the solder H, but instead connection terminals 106a may be formed by performing a plating treatment using photolithography before mounting the semiconductor substrate 104 on the one main surface 101a of the wiring substrate 101 as in the other example of a connection terminal illustrated in FIG. 4.

Thus, the solder H does not wet the connection terminals 106 as with the connection terminal 106 illustrated in FIG. 3, connection terminals 106a having a fine diameter can be formed with high accuracy and therefore the arrangement interval of the connection terminals 106a can be reduced. In addition, connection terminals may be formed by forming via holes by subjecting the first resin layer 107 in which the semiconductor substrate 104 is buried to for example laser processing, filling the formed via holes with a conductive paste of for example Ag or Cu and then performing via fill plating.

Figure 5:
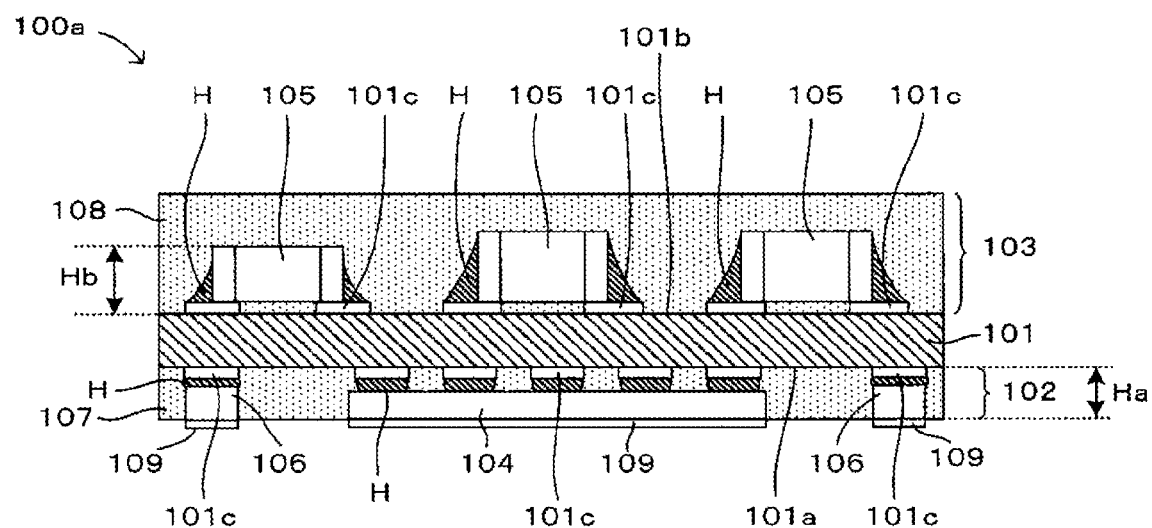
FIG. 5 illustrates a modification of the module.
Figure 6:
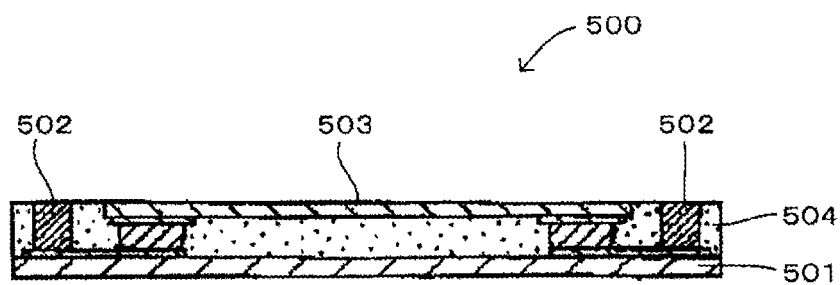
FIG. 6 is a sectional view of a module of the related art.

In addition, as a modification of the module illustrated in FIG. 5, by forming the first resin layer 107 so that only the back surface of the semiconductor substrate 104 and the tip surfaces of the connection terminals 106 provided on the one main surface 101a of the wiring substrate 101 of the module 100a are exposed, the front surface of the first resin layer 107, the back surface of the semiconductor substrate 104 and the tip surfaces of the connection terminals 106 may form a single surface, that is, be formed in a flush state.

In addition, a plurality of semiconductor substrates 104 may be mounted on the one main surface 101a of the wiring substrate 101 and electronic components and semiconductor substrates other than the chip components 105 may be mounted as components on the other main surface 101b of the wiring substrate 101. That is, it is sufficient that a configuration be adopted in which only the semiconductor substrate 104 having a back surface that can be subjected to polishing or grinding is mounted as a component on the one main surface 101a of the wiring substrate 101, and any type of component may be appropriately mounted on the wiring substrate 101 so as to increase the mounting density and realize the functions needed for the intended use of the module 100.

In addition, the number of connection terminals 106 formed on the one main surface 101a of the wiring substrate 101 is not limited to that given in the example described above and the connection terminals 106 may be also formed on the other main surface 101b of the wiring substrate 101. In addition, the connection terminals 106 do not necessarily have to be arranged on the one main surface 101a of the wiring substrate 101. That is, the connection terminals 106 and the semiconductor substrate 104 may be respectively arranged on different main surfaces of the wiring substrate 101 from each other. In addition, it is sufficient that the thickness of the first component layer 102 be formed as to be smaller than the thickness of the second component layer 103 (second resin layer 108), and the resin layers 107 and 108 need not necessarily be provided on the two main surfaces 101a and 101b of the wiring substrate 101.

In addition, the metal films 109 do not necessarily have to be formed on the back surface of the semiconductor substrate 104 and on the tip surfaces of the connection terminals 106 and it is sufficient that the metal films 109 be formed in accordance with the intended use of the module 100. In addition, in the case where the semiconductor substrate 104 and the connection terminals 106 are respectively arranged on different main surfaces of the wiring substrate 101 from each other, the metal films 109 can be made to function as shield layers of the module 100 by forming the metal films 109 not only on the back surface of the semiconductor substrate 104 but also around the periphery of the first resin layer 107. In addition, the connection of the mother substrate 2 and the module 100 is not limited to being realized using the solder H, and for example the mother substrate 2 and the module 100 may be electrically connected to each other using a conductive adhesive. Furthermore, the back surface of the semiconductor substrate 104 and the mounting surface 2a of the mother substrate 2 do not necessarily have to be connected to each other using solder as in the above-described embodiment, and the back surface of the semiconductor substrate 104 and the mounting surface 2a of the mother substrate 2 may be arranged so that they simple contact each other. In addition, the back surface of the semiconductor substrate 104 and the mounting surface 2a of the mother substrate 2 may be arranged so as to have a gap therebetween.

Furthermore, the method of mounting components on the two main surfaces 101a and 101b of the wiring substrate 101 of the module 100 is not limited to using solder H, and the components may be mounted on the wiring substrate 101 using a mounting method that employs a surface activation technique using an ultrasound vibration technique or plasma for example.

The present invention can be widely applied to modules in which components are mounted on both main surfaces of a wiring substrate.

100, 100a module
101 wiring substrate
101a one main surface
101b other main surface
102 first component layer
103 second component layer
104 semiconductor substrate (component)
105 ceramic multilayer chip component (component)
106, 106a connection terminal
107 first resin layer
108 second resin layer

The invention claimed is:

1. A module in which components are mounted on both of main surfaces of a wiring substrate, comprising:
   a first component layer provided on one main surface of the wiring substrate and comprising only a semiconductor substrate as a component mounted face down on the one main surface; and
   a second component layer provided on another main surface of the wiring substrate and comprising a plurality of components mounted on the other main surface;
   wherein a thickness of the first component layer is smaller than a thickness of the second component layer,
   the first component layer includes a first resin layer provided on the one main surface and covering side surfaces of the semiconductor substrate such that a back surface of the semiconductor substrate on the one main surface of the wiring substrate is exposed,
   the second component layer includes a second resin layer provided on the other main surface and covering each of the plurality of components on the other main surface of the wiring substrate, and
   a linear expansion coefficient of a resin forming the first resin layer is larger than a linear expansion coefficient of a resin forming the second resin layer.

2. The module according to claim 1,
   wherein the thickness of the first component layer is smaller than a height of a component
having a smallest height from the other main surface among the plurality of components mounted on the other main surface of the wiring substrate.

3. The module according to claim 2,
   wherein the first component layer includes a plurality of columnar external connection terminals provided in an upright manner on the one main surface of the wiring substrate and electrically connected to the semiconductor substrate mounted on the one main surface, and
   the plurality of columnar external connection terminals includes a ground terminal.

4. The module according to claim 2,
   wherein a surface area in plan view of the semiconductor substrate mounted on the one main surface of the wiring substrate is larger than a surface area in plan view of each of other components among the components mounted on both of the main surfaces.

5. The module according to claim 2,
   wherein the first component layer includes a first resin layer provided on the one main surface and covering side surfaces of the semiconductor substrate such that a back surface of the semiconductor substrate on the one main surface of the wiring substrate is exposed,
   the second component layer includes a second resin layer provided on the other main surface and covering each of the plurality of components on the other main surface of the wiring substrate, and
   a linear expansion coefficient of a resin forming the first resin layer is larger than a linear expansion coefficient of a resin forming the second resin layer.

6. The module according to claim 2,
   further comprising an electrical circuit formed on a surface of the semiconductor substrate facing to the one main surface of the wiring substrate,
   wherein the plurality of components on the other main surface of the wiring substrate include a ceramic multilayer chip component.

7. The module according to claim 1,
   wherein the first component layer includes a plurality of columnar external connection terminals provided in an upright manner on the one main surface of the wiring substrate and electrically connected to the semiconductor substrate mounted on the one main surface, and the plurality of columnar external connection terminals includes a ground terminal.

8. The module according to claim 7,
   further comprising an electrical circuit formed on a surface of the semiconductor substrate facing to the one main surface of the wiring substrate,
   wherein the plurality of components on the other main surface of the wiring substrate include a ceramic multilayer chip component.

9. The module according to claim 7,
   wherein a surface area in plan view of the semiconductor substrate mounted on the one main surface of the wiring substrate is larger than a surface area in plan view of each of other components among the components mounted on both of the main surfaces.

10. The module according to claim 7,
   wherein the first component layer includes a first resin layer provided on the one main surface and covering side surfaces of the semiconductor substrate such that a back surface of the semiconductor substrate on the one main surface of the wiring substrate is exposed,
   the second component layer includes a second resin layer provided on the other main surface and covering each of the plurality of components on the other main surface of the wiring substrate, and
   a linear expansion coefficient of a resin forming the first resin layer is larger than a linear expansion coefficient of a resin forming the second resin layer.

11. The module according to claim 1,
   wherein a surface area in plan view of the semiconductor substrate mounted on the one main surface of the wiring substrate is larger than a surface area in plan view of each of other components among the components mounted on both of the main surfaces.

12. The module according to claim 11,
wherein the first component layer includes a first resin layer provided on the one main surface and covering side surfaces of the semiconductor substrate such that a back surface of the semiconductor substrate on the one main surface of the wiring substrate is exposed, the second component layer includes a second resin layer provided on the other main surface and covering each of the plurality of components on the other main surface of the wiring substrate, and a linear expansion coefficient of a resin forming the first resin layer is larger than a linear expansion coefficient of a resin forming the second resin layer.

13. The module according to claim 11,
further comprising an electrical circuit formed on a surface of the semiconductor substrate facing to the one main surface of the wiring substrate, wherein the plurality of components on the other main surface of the wiring substrate include a ceramic multilayer chip component.

14. The module according to claim 1,
further comprising an electrical circuit formed on a surface of the semiconductor substrate facing to the one main surface of the wiring substrate, wherein the plurality of components on the other main surface of the wiring substrate include a ceramic multilayer chip component.

15. The module according to claim 1,
further comprising an electrical circuit formed on a surface of the semiconductor substrate facing to the one main surface of the wiring substrate, wherein the plurality of components on the other main surface of the wiring substrate include a ceramic multilayer chip component.

* * * * *